United States Patent [19]

Spence

[11] 4,250,408
[45] Feb. 10, 1981

[54] CLOCK PULSE AMPLIFIER AND CLIPPER

[75] Inventor: John R. Spence, Villa Park, Calif.

[73] Assignee: Rockwell International Corporation, El Segundo, Calif.

[21] Appl. No.: 16,249

[22] Filed: Feb. 28, 1979

[51] Int. Cl.[3] .......................... H03K 5/08; H03K 5/13
[52] U.S. Cl. ..................................... 307/237; 307/269
[58] Field of Search .................. 307/237, DIG. 3, 269

[56] References Cited
U.S. PATENT DOCUMENTS

| 3,286,189 | 11/1966 | Mitchell et al. | 307/237 |
|---|---|---|---|
| 3,437,836 | 4/1969 | Hull | 307/237 |
| 3,809,926 | 5/1974 | Young | 307/237 |
| 3,999,084 | 12/1976 | Beaudette | 307/237 |

Primary Examiner—Harold A. Dixon
Attorney, Agent, or Firm—H. Fredrick Hamann; Daniel R. McGlynn; Wilfred G. Caldwell

[57] ABSTRACT

A voltage regulator circuit for reducing the noise sensitivity of digital logic circuits by controlling the voltage amplitude range of the clock signal.

The circuit includes sensing means connected to the clock input for determining the range of the voltage amplitude of the input clock signal, a regulator circuit connected to the sensing circuit for limiting the voltage swing of the clock signal, and a clock output connected to the regulator circuit for supplying an output clock signal having a predetermined voltage amplitude range.

11 Claims, 6 Drawing Figures

CLOCK PULSE AMPLIFIER AND CLIPPER

BACKGROUND OF THE INVENTION

The invention relates to voltage regulator circuits for use in digital logic circuits for the purpose of reducing noise sensitivity, and in particular to voltage regulator circuits for use in clock drivers fabricated using MOS technology.

Several techniques are known in the prior art for reducing the effect of noise in a digital logic system, particularly in systems with multiphase clocking in which noise introduced by capacitive coupling is a significant problem. One technique, such as represented by Booher (U.S. Pat. No. 3,518,451), utilizes a gating system in which the outputs of each stage are isolated during certain intervals while the inherent capacitance associated with the MOS devices in each stage is charged.

Another technique is to employ additional padding capacitance in the circuit. In this technique the storage capacitance associated with the logic circuit is increased. The ratio of the noise capacitance to the total holding non-noise capacitance is increased until an acceptable level of noise is reached. The drawback of such a technique is that corresponding to the increase in capacitance is a reduction in speed of the logic circuit itself.

The problem of noise becomes even a more significant one as the supply voltage is increased. As more and more circuits are used in applications which utilize battery power supplies, the circuits are required to operate over wider voltage ranges. However, at such higher voltages the noise is also increased, increasing the likelihood of a logical error during operation. In such instances, the techniques of the prior art are not sufficient in controlling the noise, particularly in systems using multiphase clocking.

SUMMARY OF THE INVENTION

It is an object of the invention to provide a circuit for changing the voltage range of a clocked signal in a digital system from a predetermined first value to a predetermined second value.

It is another object of the invention to provide a voltage sensing and regulator circuit for limiting the amplitude of a clocked signal in a digital system.

It is still another object of the invention to provide an improved clock driver circuit which includes a regulator for proportionally reducing the voltage range of a clocked signal applied thereto to a predetermined smaller voltage range to limit or clip the clock signal applied thereto to a predetermined value.

It is yet another object of the invention to provide a sensing and regulator circuit in a clocked digital system including a voltage reference input for compensating for process parameter variations.

The invention provides a clock input for supplying a clock input signal having a predetermined first voltage range; a sensing circuit connected to the clock input for detecting the voltage level of the clock input signal; a regulator circuit having an input connected to the sensing circuit, and an output, the regulator circuit functioning to reduce the predetermined first voltage range of the clock signal to a predetermined smaller second voltage range; and a clock output connected to the output of the regulator circuit for producing a clock output signal having the predetermined second voltage range.

In accordance with one embodiment of the invention, a driver circuit is provided including a first depletion mode FET having its drain to source path connected between a first fixed potential and a first intermediate node, and its gate electrode connected to a second intermediate node; a first enhancement mode FET having its source connected to said intermediate node, its drain connected to a second fixed potential, and its gate connected to a reference circuit; a second enhancement mode FET having its source connected to said second intermediate node, its drain connected to said second fixed potential, and its gate connected to said first intermediate node; and a third enhancement mode FET having its source connected to said drive circuit, its drain connected to said second fixed potential, and its gate connected to said first intermediate node, whereby the output has a potential which is limited to a predetermined range smaller than said range of said potential on said input.

DESCRIPTION OF THE PREFERRED EMBODIMENTS

Figure 1:
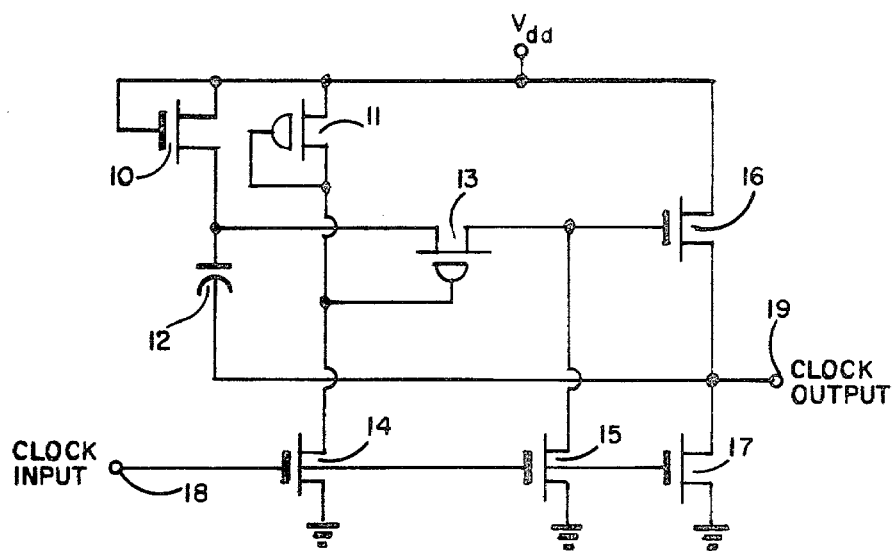
FIG. 1 is a schematic diagram of a prior art clock driver circuit.

FIG. 1 is a schematic diagram of a clock driver circuit such as known in the prior art fabricated using p-channel metal oxide semiconductor (MOS) field effect transistors (FET). Although a clock driver circuit is shown by way of example to illustrate the affect of noise on a clock signal, it is to be understood that the present invention may be implemented in any type of digital logic or memory circuit, using any suitable semiconductor technology. Clock driver circuits are well known, and therefore only a brief description of the structure and operation of the circuit shown is presented here. For a more detailed description of clock driver circuits, reference may be made to U.S. Pat. No. 4,042,838. For a more detailed description of MOS circuits which operate with a multiphase system, and particularly a discussion of the problem of noise in such circuits, reference is made to U.S. Pat. No. 3,518,451 issued June 30, 1970.

Turning now specifically to the circuit in FIG. 1, we note there are a first relatively positive, and a second relatively negative source of fixed reference potential, $V_{DD}$ and $V_{SS}$. The typical operating reference potential $V_{DD}$ is $-15$ volts d.c. for a system fabricated using PMOS technology, while $V_{SS}$ is ground, as shown in the Figure. FETs 10, 14, 15, 16, and 17 are enhancement mode devices, while FETs 11 and 13 are depletion mode devices. FETs 10, 11 and 16 have their source terminal connected to $V_{DD}$. The gate of FET 10 is connected to its source terminal, while the gate of FET 11 is connected to its drain terminal. The conduction paths of FETs 11 and 14 are connected in series between $V_{DD}$ and ground. An input clock signal having a predetermined voltage range is supplied to the gate of FET 14 at the clock input at 18. The input clock signal is derived from a clock generator circuit, such as an oscillator (not shown). A storage capacitor 12 is provided between the drain terminal of FET 10 and the clock output 19. Another FET 13 is provided having its conduction path connected between the drain of FET 10 and the gate of FET 16. The gate of FET 13 is connected to the drain of FET 11.

FETs 16 and 17 have their conduction path connected in series between $V_{DD}$ and ground. The gate of FET 17 is connected to the clock input 18. The drain of FET 16 is connected to the clock output 19.

A FET 15 is further provided having its source connected to the gate of FET 16 and its drain connected to ground. The gate of FET 15 is also connected to the clock input 18.

The operation of the clock driver circuit shown in FIG. 1 will be described later in conjunction with the timing diagram of FIG. 4.

Figure 2:
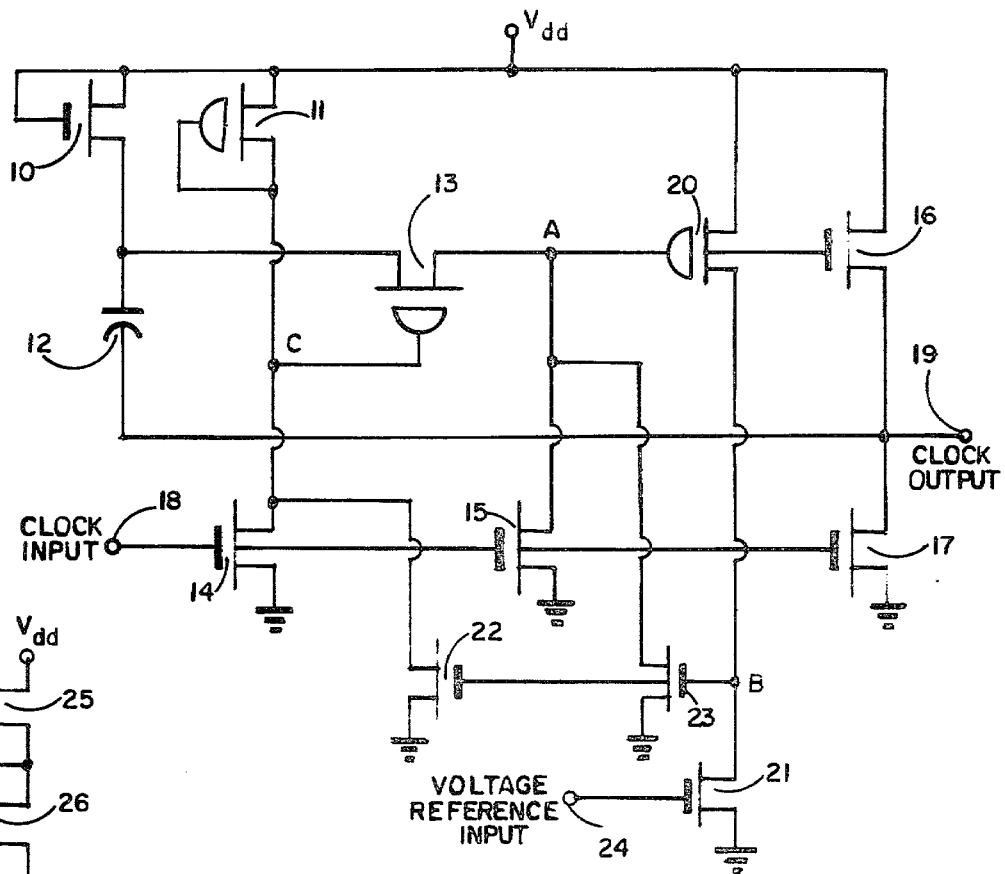
FIG. 2 is a schematic diagram of an improved clock driver circuit incorporating an embodiment of the present invention.

FIG. 2 is an improved clock driver circuit incorporating a sensing and a regulating circuit according to the present invention. The same reference numerals are used for corresponding components in the clock driver circuit of FIG. 2 as for the components in FIG. 1. It must be noted that FIG. 2 also includes four additional FETs connected in the circuit, namely FETs 20, 21, 22 and 23. The voltage sensing circuit comprises FETs 20 and 21, while the regulating circuit comprises FETs 22 and 23. It is to be understood that the use of these four FETs in the configuration shown in a clock driver circuit is merely exemplary, and that alternative circuit configurations for sensing and regulating may also be implemented according to the teaching of the present invention.

FET 20 is a depletion mode FET having its drain to source path connected between a relatively positive first fixed potential ($V_{DD}$) and a first intermediate node B, and its gate electrode connected to a second intermediate node A. FET 21 is an enhancement mode FET having its source connected to the first intermediate node B, its drain connected to a relatively negative second fixed potential (ground) and its gate connected to a voltage reference input 24. Further details on the voltage reference input will be provided below. FET 23 is another enhancement mode FET having its source connected to the second intermediate node, its drain connected to the second fixed potential (ground) and its gate connected to the first intermediate node B. FET 22 is another enhancement mode FET having its source connected to the clock buffer circuit, its drain connected to the second fixed potential (ground) and its gate connected to the first intermediate node B.

The operation of the clock driver circuit shown in FIG. 2 will be described later in conjunction with the timing diagram of FIG. 4.

Figure 3:
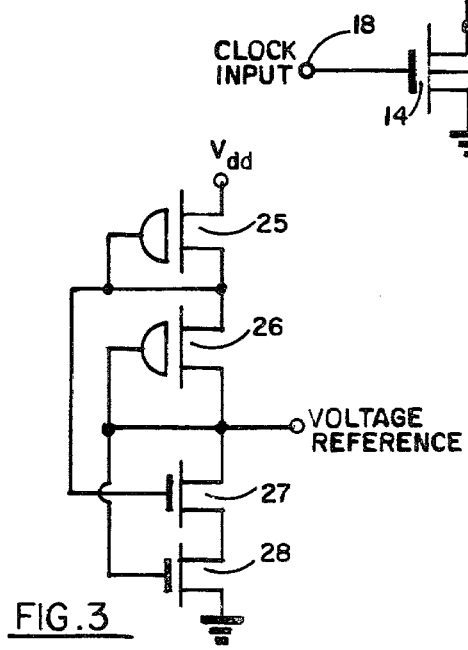
FIG. 3 is a schematic diagram of a voltage reference circuit for use with the embodiment of the present invention as implemented in the improved clock driver circuit of FIG. 2.

FIG. 3 is a schematic diagram of the voltage reference circuit which is connected to the voltage reference input in the circuit according to the invention shown in FIG. 2. The voltage reference circuit consists of a first depletion mode FET 25 having its source connected to a first source of reference potential $V_{DD}$, and its gate connected to its drain. A second depletion mode FET 26 has its source connected to the drain of the first FET 25 and its gate connected to its drain. A first enhancement mode FET 27 has its source connected to the drain of the second depletion mode FET 26, while the gate of the first enhancement mode FET 27 is connected to the gate of the first depletion mode FET 25. A second enhancement mode FET 28 has its source connected to the drain of the first enhancement mode FET and its drain connected to ground. The gate of the second enhancement mode FET 28 is connected to the gate of the second depletion mode FET 26. These gates are connected to an output labelled "voltage reference" of the circuit of FIG. 3. As pointed out above, this output is connected to the voltage reference input 24 of FIG. 2.

The operation of the voltage reference circuit shown in FIG. 3 is basically as follows. FETs 25 and 26 operate as current sources, that is the current through item is relatively independent of the variations in $V_{DD}$. FETs 27 and 28 are connected to the gates of FETs 25 and 26 respectively for controlling or regulating the current through FETs 25 and 26. This is necessary since FETs 25 and 26 are not really perfect current sources. FETs 27 and 28 are necessary since variations in the voltage $V_{DD}$ will effect the voltage at the drain of FET 25. For example, an increase in the voltage $V_{DD}$ will result in an increase in the voltage at the drain of FET 25, and therefore an increase in the corresponding output voltage at the drain of FET 26. Since the object of the circuit in FIG. 3 is to provide a voltage reference, means must be provided so that a slight increase in the voltage $V_{DD}$ will not affect the output at the voltage reference point. If indeed the voltage does increase at the drain of FET 26, FET 27 will be turned on more than it was previously. Moreover, FET 28 further refines the voltage regulation by compensating for differences in threshold variation from part to part due to production tolerances. For example, if the thresholds are higher in all the enhancement FETs in the circuit, the threshold of FET 28 will also be higher. This will for a given $V_{DD}$ result in a higher reference voltage which will ultimately compensate for the higher threshold voltage in FET 21. FET 25 and FET 26 are both depletion FET's and act as current sources. For this reason they have a small width to length ratio. FET 27 and FET 28 act as an impedance through which the current from FET 25 and FET 26 flow giving a relatively fixed voltage. They have a high width to length ratio. The voltage at the node labelled "Voltage Reference" is the fixed reference voltage produced by the circuit of FIG. 3. The voltage at the node formed between the conduction path electrode of FET 25 and the conduction path electrode of FET 26 tends to increase as $V_{DD}$ increases. Since FET 25 and FET 26 are not perfect current sources, their current increases slightly also. Normally this would make the voltage at "Voltage Reference" node also increase. However by connecting the node formed between the conduction path electrode of FET 25 and the conduction path electrode of FET 26 to the gate of FET 27, it reduces FET 27's impedance, thus lowering the voltage on "Voltage Reference" node and nullifying the previous voltage increase. The reference voltage at the "Voltage Reference" node is connected to the gate of FET 28. The impedance of FET 28 is inversely proportional to $V_g-V_t$, where $V_g$ is the gate voltage, equal to the voltage on the "Voltage Reference" node, and $V_t$ is the threshold voltage of FET 28. If the threshold of FET 28 were higher due to process variations the impedance of FET 28 would also be higher thus raising the voltage at the "Voltage Reference" node. Thus the reference circuit produces an output voltage proportional to the threshold voltages. The degree of this effect can be controlled by the width to length ratio of FET 28. In the embodiment according to the present invention, the width to length ratios of the FETs are appropriately chosen to limit and clip the input clock signal at a predetermined level determined by the application.

Figure 4:
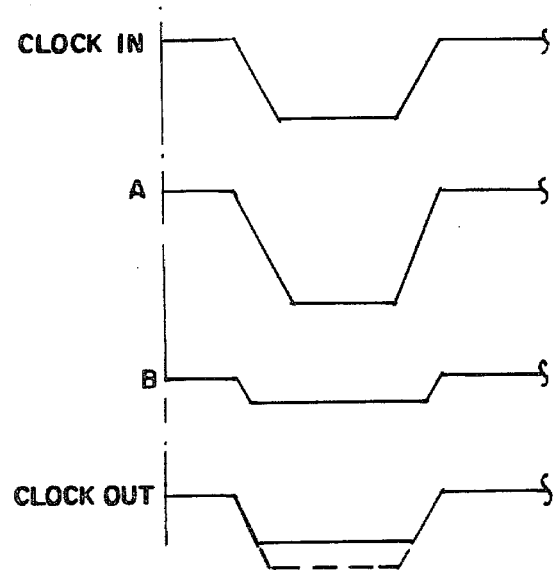
FIG. 4 is a timing diagram of the operation of the circuit shown in FIG. 2 at four specific points.

FIG. 4 is a timing diagram of the clock driver circuit shown in FIG. 2, and can be used to describe the operation of the clock driver circuit of FIGS. 1 and 2. The top waveform shows the clock input signal applied to the clock input of FIG. 2. Only one clock cycle of the clock input signal is shown for simplicity. We first consider the operation of FETs 11, 13, 14, and 15. Referring again either to FIG. 1 or FIG. 2, FETs 11 and 14 form a standard inverter configuration using a depletion load. With the clock negative, FET 14 would be on and would have a relatively low impedance compared to FET 11. The signal on the gate of FET 13 would then be very close to ground potential. Since 13 is a depletion mode FET, the current through it is regulated by the voltage on its gate. At the time instant under consideration, since the gate voltage is $V_{SS}$ or ground, the potential at point A would also be close to ground. FET 15 would also be on for the same reason that FET 14 would be on when the clock input is negative. FET 17 would similarly be on so that the output of the clock driver with the input negative would be close to ground potential.

However, another effect is also operating in the circuit at the same time. The node between the FET 10 and the storage capacitor 12 has a potential slightly below that of $V_{DD}$. Since we stated above that the clock output 19 would have ground potential, one side of the capacitor 12 has a potential slightly below $V_{DD}$ and the other side of ground potential, or the potential of the clock output 19. The capacitor 12 therefore has a charge on it of, for example, 6.5 volts. Consideration now must be given to the effect of FET 16. FET 16 operates as a capacitance which we can call $C_{G16}$. The capacitance of capacitor 12 is designed to be considerably larger than that of $C_{G16}$. Now as the clock goes positive, FETs 14, 15 and 17 all turn off. We pointed out above that point A would tend to go negative since there is a current through FET 10 and 13 which pulls the point A negative since FET 15 is off. When FET 15 is off, FET 10 in combination with FET 13 function like a pull-up impedance, and as a result they pull point A negative whereas normally point A would be at ground potential. Consider now the effect at the clock output 19. The clock signal on clock output essentially follows node A by a threshold level drop in voltage. Let us suppose, for example, that the threshold level is 1.5 volts; the potential at 19 is then increased by 1.5 volts. This in turn results in a change in the charge on the storage capacitor 12 by 1.5 volts, so that the charge on the upper plate of the capacitor is boosted from 6.5 volts to 8 volts. The circuit permits a regenerative action, so that the voltage is passed through FET 13 to node A so that the resulting voltage at node A is substantially higher than $V_{DD}$. The timing diagram in FIG. 4 illustrates this fact by indicating the amplitude at the point A as significantly greater than that of the clock input signal, which typically corresponds to $V_{DD}$. It is also noted that the rise time of the pulse at the point A is slightly longer than that of the rise time of the clock impulse due to the operation of this regenerative action.

The above description is generally applicable to both FIG. 1 and FIG. 2. We now turn to the more specific configuration of FIG. 2, and in particular the role of FETs 20, 21, 22 and 23 in the circuit according to the present invention. Briefly, these FETs function to limit the regenerative action so that the gate of FET 16 does not become substantially more negative than $V_{DD}$. FETs 20 and 21 are referred to as the sensing circuit, and FETs 22 and 23 as the regulating circuit, as we have noted above. FET 23 is connected to node A, and FET 22 is connected to the gate of FET 13. The function of FETs 22 and 23 are to reduce or limit the potential at such points.

The FETs 22 and 23 operate in the circuit to substantially linearly proportionally reduce the amplitude V of an input signal with a voltage $V<V_1$ (where $V_1$ is a predetermined value) to a value $\alpha V$, where $\alpha$ is a predetermined constant, $0<\alpha<1$. For an amplitude $V>V_1$, the regulating circuit functions to limit or clip the applied voltage to a value substantially equal to $\alpha V_1$.

It should be noted that FET 23 cannot operate alone in reducing or limiting the voltage at point A, since FET 23 has such a high impedance. Consideration must therefore be given to the operation of FET 13 and in particular the potential on its gate. It is noted that FET 13 is a depletion mode FET. If one connects the gate of a depletion mode FET to ground it will have a certain current. If however the gate is connected to $V_{DD}$, the current will be almost twenty times as great as the previous case. More particularly, the impedance of the FET varies as the square of the voltage on its gate. Therefore, in order to make FET 23 effective in controlling the voltage at point A, the voltage on the gate of FET 13 must be controlled. This is done through FET 22.

The operation of the sensing and regulating circuits may now be described. The "input" of the sensing circuit is node A. Node A represents a voltage which is sensed by the sensing circuit which is translated into a current. The voltage on the gate of FET 20 is translated into a variation in current along the source to drain path of FET 20. FET 20 functions to produce a current on the source to drain path that is proportional to the square of the voltage on its gate. FET 21 is in series connection with FET 20 and therefore reacts to the current from FET 20 so as to create a voltage at node B which is related to the voltage at node A. As shown in the timing diagram in FIG. 4, the voltage at node B follows in time the clock pulse of clock-in, but at a much smaller amplitude. When the voltage at node B exceeds the threshold voltage of FETs 22 and 23, they will turn on. At this point the voltage at point A and point C will be limited from any further increases. The voltage reference input on the gate of FET 21 controls its impedance and ultimately the voltage at node B during the time a clock input is being applied to the circuit. For example, if the voltage reference is increased, FET 21 will have a lower impedance. A higher current will now be required from FET 20 to produce a voltage that exceeds the threshold of FET's 23 and 22. Since the current from FET 20 is proportional to the square of the voltage on its gate, a higher voltage is now required at node A before the voltage limiting point is reached. It can be seen that the voltage reference input acts to control the voltage at node B and ultimately the voltage at point A.

For a $-V_{DD}$ of 9 volts the typical reference voltage is 2 volts. The reference voltage is insensitive to any increase or a relatively small decrease in $V_{DD}$. The reference voltage which controls the impedance of FET 21 and the current flowing through FET 21 from FET 20 then set the voltage at which the clipping takes place. As previously stated, the reference circuit has a built-in means to compensate for varying threshold levels. That is, if the threshold voltage of all enhancement FETs in the circuit is higher, the reference voltage supplied by the reference circuit to the gate of FET 21 will be correspondingly lower. The impedance of FET 21 will therefore be higher. For a given current flowing through FET 21, a higher voltage will be produced on the gate of FET 22 and 23. This in turn will compensate for this higher threshold voltage, and tend to make them turn on at a $V_{DD}$ value independent of the threshold level. As we have pointed out above, node B is connected to the gate of FET 23 which regulates or controls the voltage at node A. Since node A is connected to the gate of FET 16, the voltage at node A is directly related to the voltage amplitude of the clock output signal which is to be regulated by the present invention.

The last waveform shown in FIG. 4 is that of the output clock signal from the circuits of FIG. 1 and FIG. 2. The waveform shown in solid line is the output clock signal from the circuit according to the present invention shown in FIG. 2. The waveform shown in a dotted line and superimposed on the waveform shown in solid line in the output clock signal from the circuit according to the prior art shown in FIG. 1.

It should be noted from FIG. 4 that the output clock signal corresponds in phase and duration to the input clock signal. The objective of the present invention to change the voltage range of the clock input signal is illustrated in FIG. 4 by explicitly showing that the voltage range of the amplitude of the output clock signal is limited to a range smaller than the range of the input clock signal.

Figure 5A:
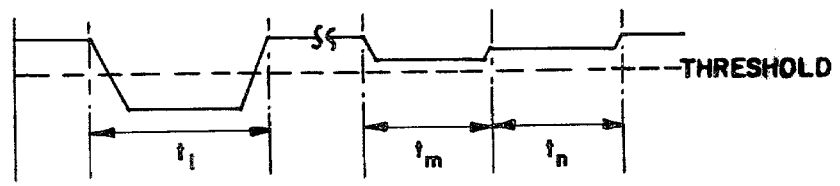
FIG. 5A is a timing diagram of the logic signal that is affected by negative noise in the prior art clock driver circuit of FIG. 1.

FIG. 5 is a timing diagram comparing a clock signal produced by the clock output of the clock driver circuit of FIG. 1, with a clock output produced by a clock driver circuit according to the present invention as embodied in FIG. 2 FIG. 5A, the output clock signal produced by the circuit of FIG. 1, is shown to have a clock pulse during the $t_1$ time interval corresponding to the input clock signal. At a later time interval or intervals, $t_m$ and $t_n$, a negative noise pulse is shown. The source of the negative noise pulse is a clock pulse associated with a clock signal of a different phase on an adjacent conductor. Such sources of negative noise are quite frequent in multiphase logic systems where conductors are adjacent or have cross-overs on the surface of the semiconductor chip. Such negative noise sources are capacitively coupled with the conductor carrying the clock signal being considered, and the resulting noise signal appears as a decrease in the voltage on the clock signal conductor from a level of normal ground potential to a lower value. Such noise is therefore referred to as "negative" noise in a system fabricated using PMOS technology. The noise pulse has a shape substantially identical to the clock signal pulse on the adjacent conductor which is interferring with the signal on the conductor in question. As shown in FIG. 5A, such negative noise can be substantial, particularly when the capacitive coupling is relatively strong. Since the circuit is intended to be operable over a relatively wide range of power supply voltages, the operation of the circuit at a $V_{DD}$ value which is near the high end of the range would result in substantial excursions for such noise values. In those instances where the capacitive coupling is strong, such excursions may exceed the logical threshold level shown by a horizontal dotted line in FIG. 5A. The horizontal dotted line defines when a signal amplitude is to be interpreted by the system logic as having a logical value of 1. If such noise results in the introduction of a logical value of 1 where a 0 value was intended, an operational error may occur in the system.

It is therefore the intent of the described embodiment of the present invention to reduce and limit the amplitude of clock signal so that the entire integrated circuit may be powered by a voltage at the upper end of its range of allowable operating voltage range of the integrated circuit. The most sensitive signal in the circuit, the clock signal, will be limited in amplitude so that the internal circuits on the chip see only a very limited voltage range for the clock signal, although the chip itself operates externally over a much wider voltage range.

More specifically, the circuit according to the present invention functions to proportionally reduce by a predetermined factor $\alpha$ in a substantially linear manner the applied input voltage over a specific voltage range $V_o < V < V_1$, to produce an output voltage $\alpha V$, where $V_o$ and $V_1$ are constants within the applied voltage range of the input signal, and $0 < \alpha < 1$. For an applied input voltage $V > V_1$, the circuit functions to clip the applied voltage to produce an output voltage substantially equal to $\alpha V_1$.

In the present embodiment of the circuit as implemented using p-channel MOSFETs, $V_o$ may range from 0 to 20 volts, and $V_1$ from 5 to 20 volts. The preferred implementation uses $V_1$ about 8 volts. The proportionality factor $\alpha$ may range from 0.4 to 1.0.

Figure 5B:
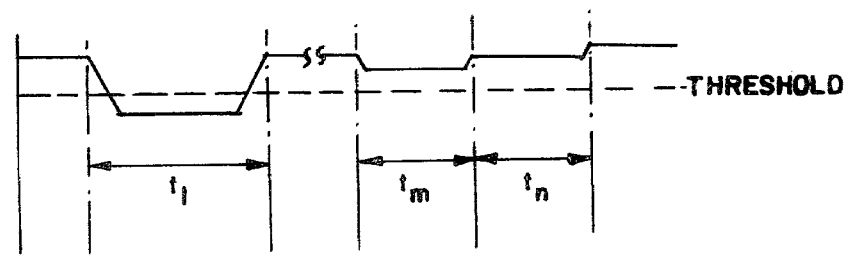
FIG. 5B is a corresponding timing diagram of the logic signal affected by negative noise of the improved clock driver circuit according to the present invention shown in FIG. 2.

FIG. 5B is the output clock signal produced by the circuit of FIG. 2, and shows the effect of the sensing and regulating circuit according to the present invention on the clock signal. The same logical threshold level shown by the horizontal dotted line used in FIG. 5A is shown in FIG. 5B for comparison purposes. During time interval $t_1$ a clock signal is shown having the same general shape (i.e. rise time, fall time, and duration) as the clock signal shown in FIG. 5A, although with a diminished amplitude. The extent of the diminished amplitude is represented by the output clock signal shown in FIG. 4 in which the clock pulse signal shown in solid line is the output clock signal generated by the present invention, while the output clock signal shown with a dotted line is the output clock signal generated by the prior art circuit.

Returning to FIG. 5B, at some later time, shown as time intervals $t_m$ and $t_n$, a negative noise signal appears due to a clock signal of a different phase appearing on an adjacent conductor. It is now seen that the negative noise signals are proportionally reduced in magnitude similar to that of the output clock signal $t_1$. It is noted that the negative noise signals during intervals $t_m$ and $t_n$ are at a considerable distance from that of the dotted line, i.e., the logical threshold. Thus, there is very little likelihood that the negative noise which occurs during a time when the clock signal is at a logical value 0 can so effect the output clock signal so as to be interpreted as logical 1. Thus the present invention has achieved the objective of increasing the absolute voltage difference between the most negative value of the negative noise and the threshold for a logical 1, therefore reducing the noise sensitivity of the circuit.

While a preferred embodiment of the invention has been shown and described above, various modifications and changes may be made without departing from the true spirit and scope of the present invention. For example, other types of sensing and regulating circuits may be used, using any suitable technology. It is also to be understood that the clock pulses, voltage levels, and noise signal characteristics are for exemplary purposes only. The signals applied to the sensing and regulating circuit according to the present invention may be waveforms other than clock signals, and the signal applied at $V_{DD}$ and the voltage reference input may also be appropriately selected, as desired, for a particular application.

I claim:

1. A voltage regulator circuit comprising:
   clock input means for supplying a clock input signal having a predetermined first voltage range;
   sensing means connected to said clock input means for detecting the voltage level of said clock input signal;
   regulating means having an input connected to said sensing means and an output, said regulating means functioning to reduce said predetermined first voltage range of said clock signal to a smaller second voltage range; and
   clock output means connected to said output of said regulating means for producing a clock output signal having said second voltage range, said regulating means functions to substantially linearly proportionally reduce the amplitude V of said input signal in the range $V_o<V<V_1$, and to clip the amplitude of said input signal in the range $V>V_1$ to substantially constant values $\alpha V_1$, where $V_o$ and $V_1$ are predetermined constants within said first voltage range, and $0<\alpha<1$.

2. A circuit as defined in claim 1, further comprising: means for applying a first relatively positive and second relatively negative potential to said circuit, wherein said sensing means comprises first and second multiterminal semiconductor devices connected in electrical series between said first and said second potentials.

3. A circuit as defined in claim 2, wherein each of said multiterminal semiconductor devices is a field effect transistor.

4. A circuit as defined in claim 2, wherein said regulating means comprises third and fourth multiterminal semiconductor devices each having their control electrode connected to the node between said first and second semiconductor devices.

5. A circuit as defined in claim 4, wherein said third and fourth multiterminal semiconductor devices are field effect transistors.

6. A circuit as defined in claim 2 further comprising voltage reference means having an output connected to the control electrode of one of said semiconductor devices for providing a predetermined voltage reference for said sensing means.

7. A circuit as defined in claim 6, wherein said voltage reference means comprises a plurality of multiterminal semiconductor devices connected in electrical series between said first and said second potentials.

8. A circuit as defined in claim 7, wherein said voltage reference means comprises a plurality of field effect transistors having respective conduction path terminals and a control terminal, including
   a first depletion mode field effect transistor having a first conduction path terminal connected to said first potential, and a second conduction path terminal connected to its control terminal;
   a second depletion mode field effect transistor having a first conduction path terminal connected to said second conduction path terminal of said first depletion mode field effect transistor, and a second conduction path terminal connected to its control terminal and to said output.

9. A circuit as defined in claim 8, further comprising a first enhancement mode field effect transistor having a first conduction path terminal connected to said output, and a control terminal connected to said control terminal of said first depletion mode field effect transistor, and
   a second enhancement mode field effect transistor having a first conduction path terminal connected to said second conduction path terminal, second conduction path terminal connected to said second source of potential, and a control terminal connected to said output.

10. A regulator circuit having an input terminal for supplying an input clock signal having a predetermined first voltage range, an output terminal, a first source of relatively positive and a second source of relatively negative electrical potential, and a voltage reference input, said circuit comprising:
   a plurality of multi-terminal semiconductor means having respective conduction path terminals and a control terminal and interconnected between said input and output terminals, including
   a first depletion mode FET having one conduction path terminal connected to said first source of electrical potential, the other conduction path terminal connected to a first intermediate node, and its control terminal connected to a second intermediate node;
   a first enhancement mode FET having one conduction path terminal connected to said first intermediate node, the other conduction path terminal connected to said second source of electrical potential, and its control terminal connected to said voltage reference input;
   a second enhancement mode FET having one conduction path terminal connected to said second intermediate node, the other conduction path terminal connected to said second source of potential, and its control electrode connected to said first intermediate node; and
   a third enhancement mode FET having one conduction path terminal connected to said input terminal, the other conduction path terminal connected to said second source of potential, and its control electrode connected to said first intermediate node;
   said second intermediate node functioning to control said output terminal for producing an output clock signal thereon corresponding in phase and duration to said input clock signal;
   said second and third FETs functioning to regulate the amplitude of the signal at said second intermediate node so that the clock signal produced on said output terminal has a voltage range limited to a predetermined second range smaller than said first range.

11. A circuit as defined in claim 10, wherein said second and third FETs function to substantially lineary proportionally reduce the amplitude V of said input signal in the range $V_o < V < V_1$, and to clip the amplitude of said input signal in the range $V > V_1$ to a substantially constant value $\alpha V_1$, where $V_o$ and $V_1$ are predetermined constants within said first voltage range, and $0 < \alpha < 1$.

* * * * *

UNITED STATES PATENT AND TRADEMARK OFFICE
CERTIFICATE OF CORRECTION

PATENT NO. : 4,250,408
DATED : February 10, 1981
INVENTOR(S) : John R. Spence

It is certified that error appears in the above-identified patent and that said Letters Patent are hereby corrected as shown below:

In column 2, line 16, please delete [drive] and insert --driver--.

In column 9, line 39, please delete [values] and insert --value--.

In column 11, line 4, please delete [lineary] and insert --linearly--.

Signed and Sealed this

Thirteenth Day of October 1981

[SEAL]

Attest:

GERALD J. MOSSINGHOFF

Attesting Officer

Commissioner of Patents and Trademarks